(12) United States Patent
Jiang et al.

(10) Patent No.: US 10,274,182 B2
(45) Date of Patent: Apr. 30, 2019

(54) LIGHTING DEVICE WITH AN IMPROVED HOUSING

(71) Applicant: SIGNIFY HOLDING B.V., Eindhoven (NL)

(72) Inventors: Qingqing Jiang, Eindhoven (NL); Chuan Yuan, Eindhoven (NL); Lin Nan Li, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/128,043

(22) PCT Filed: Mar. 10, 2015

(86) PCT No.: PCT/EP2015/054871
§ 371 (c)(1),
(2) Date: Sep. 21, 2016

(87) PCT Pub. No.: WO2015/139995
PCT Pub. Date: Sep. 24, 2015

(65) Prior Publication Data
US 2017/0102136 A1    Apr. 13, 2017

(30) Foreign Application Priority Data

Mar. 21, 2014 (WO) ................. PCT/CN2014/000312
Apr. 14, 2014 (EP) ...................................... 14164601

(51) Int. Cl.
*F21V 29/503* (2015.01)
*F21V 23/00* (2015.01)
(Continued)

(52) U.S. Cl.
CPC ............ *F21V 29/503* (2015.01); *F21K 9/232* (2016.08); *F21V 3/02* (2013.01); *F21V 15/01* (2013.01);
(Continued)

(58) Field of Classification Search
USPC ......................................................... 362/235
See application file for complete search history.

(56) References Cited

U.S. PATENT DOCUMENTS

2011/0140589 A1*  6/2011  Daniel .................... F21K 9/232
                                                        313/110
2011/0298352 A1   12/2011  Velu
(Continued)

FOREIGN PATENT DOCUMENTS

DE        102011006749 A1    10/2012
EP             2644974 A1    10/2013
(Continued)

*Primary Examiner* — Rafferty D Kelly
(74) *Attorney, Agent, or Firm* — Akarsh P. Belagodu (57) ABSTRACT

A lighting device (100, 300) comprising a housing (101, 301) comprising a polymer material, the housing including an elongated hollow neck portion (102) and a collar portion (104) arranged at an end of the neck portion. The collar portion includes an essentially annular surface (114, 414) surrounding the end of the neck portion peripherally. The collar portion has a metalized surface. The surface is structured into a plurality of electrically conductive pads (118, 318, 418) and the pads are electrically isolated from each other. A plurality of light emitting elements (120, 320, 420) are arranged on the collar portion of the housing. Each of the light emitting elements has a first terminal (128) electrically connected to a first electrically conductive pad (118a, 418a) and a second terminal (124) electrically connected to a second electrically conductive pad (118b, 418b). The collar portion is directly in contact with the surroundings, promoting an improved heat transfer from the light emitting elements. The lighting device further comprises an annular lens (108) arranged to cover the collar portion and configured to refract light from the light emitting elements.

9 Claims, 5 Drawing Sheets

(51) Int. Cl.
  *F21V 29/70* (2015.01)
  *F21K 9/232* (2016.01)
  *F21V 3/02* (2006.01)
  *F21V 15/01* (2006.01)
  *F21V 5/00* (2018.01)
  *H01L 25/075* (2006.01)
  *H01L 33/62* (2010.01)
  *F21Y 103/33* (2016.01)
  *F21Y 115/10* (2016.01)
  *F21K 9/238* (2016.01)

(52) U.S. Cl.
  CPC ............ *F21V 23/003* (2013.01); *F21V 29/70* (2015.01); *F21K 9/238* (2016.08); *F21V 5/00* (2013.01); *F21V 23/009* (2013.01); *F21Y 2103/33* (2016.08); *F21Y 2115/10* (2016.08); *H01L 25/0753* (2013.01); *H01L 33/62* (2013.01); *H01L 2224/49171* (2013.01)

(56) References Cited

U.S. PATENT DOCUMENTS

| | | |
|---|---|---|
| 2012/0230027 A1 | 9/2012 | Boomgaarden et al. |
| 2012/0292660 A1* | 11/2012 | Kanno .................. H01L 33/647 257/99 |
| 2013/0082600 A1 | 4/2013 | Ter-Hovhanissian |
| 2013/0178001 A1 | 7/2013 | Chin |
| 2013/0294085 A1 | 11/2013 | Watanabe et al. |
| 2014/0085884 A1 | 3/2014 | Horio et al. |

FOREIGN PATENT DOCUMENTS

| | | |
|---|---|---|
| JP | 2004071544 A | 3/2004 |
| JP | 2005093097 A | 4/2005 |
| JP | 2014002862 A | 1/2014 |
| WO | 2011140589 A | 11/2011 |

* cited by examiner

LIGHTING DEVICE WITH AN IMPROVED HOUSING

CROSS-REFERENCE TO PRIOR APPLICATIONS

This application is the U.S. National Phase application under 35 U.S.C. § 371 of International Application No. PCT/EP2015/054871, filed on Mar. 10, 2015, which claims the benefit of Chinese Patent Application No. PCT/CN2014/000312, filed on Mar. 21, 2014 and European Patent Application No. 14164601.8, filed on Apr. 14, 2014. These applications are hereby incorporated by reference herein.

FIELD OF THE INVENTION

The present invention generally relates to heat management and an improved housing in lighting devices.

BACKGROUND OF THE INVENTION

Heat management is an important issue within the field of illumination and, in particular, within the field of solid state based illumination, such as illumination based on light emitting diodes, LEDs. Generally, when light is emitted by a light source, heat is generated. The heat generation is commonly an undesired effect since it can affect performance and life expectance of the light sources, as well as the choice of materials and the configuration of electronics for the lighting device.

In order to reduce the effects of the heat generation, lighting devices normally comprise a heat sink arranged to dissipate heat from the light sources and other heat generating components, typically in the direction opposite to the main (or average) light propagation direction of the lighting device. US2013/0082600 discloses an LED lamp including a lamp housing of silicone. The lamp housing is in direct thermal conductive relation to the LED such that heat energy is dissipated from the LED towards the driver housing. The LED driver circuitry is electrically disposed between the electrical plug and the LED.

However, it would be desirable to achieve alternative solutions for improving heat dissipation from lighting devices.

SUMMARY OF THE INVENTION

It is an object of the present invention to overcome this problem, and to provide and enable an alternative lighting device with improved heat management. To better address one or more of these concerns, a lighting device having the features defined in the independent claims is provided. Preferable embodiments are defined in the dependent claims.

According to an aspect of the invention, this and other objects are achieved by a lighting device comprising a housing having an elongated hollow neck portion and a collar portion arranged at an end of said neck portion. The collar portion includes a surface surrounding the end of the neck portion peripherally. The collar portion has further a metalized surface. The surface is structured into a plurality of electrically conductive pads. The pads are electrically isolated from each other. The lighting device has a plurality of light emitting elements arranged on the collar portion of the housing and each of the light emitting elements has a first terminal electrically connected to a first electrically conductive pad and a second terminal electrically connected to a second electrically conductive pad. Further, the housing may comprise a polymer material and the surface of the collar portion may be essentially flat.

The inventors have realized that by surrounding an open end of the hollow neck portion with the collar portion and providing light emitting elements on the surface of the collar portion the lighting device will be able to dissipate heat effectively by dissipating heat directly through the collar portion to the surroundings. The structure of the housing promotes an improved heat transfer of the lighting device. In addition, at least one side of the collar portion is not enclosed so air may circulate freely and dissipate the heat generated from the lighting devices. Consequently, it is only the collar portion, a layer of polymer with a metalized surface, which separates the light emitting elements from the surrounding. The heat may transfer directly through collar portion in the opposite direction of a general light output direction to the surroundings.

Furthermore, by metalizing the surface with a plurality of electrically conductive pads the housing may also function as a PCB as well as a heat sink. A more flexible lighting device may be brought about, by providing additional functionality to the housing apart from the conventional functions of isolating and protecting the components in the lighting device.

Additionally, by having integrated function in the housing, it allows the lighting device to become cost efficient. By metalizing the surface of the collar portion with electrically conductive pads that may conduct both electricity and heat, less components are needed than for general lighting devices. Furthermore, the structure of the lighting device allows for providing the housing in material such as polymers.

According to an embodiment of the invention, the metalized surface structured into the plurality of electrically conductive pads may cover at least 75% of the surface.

By covering a substantial portion of the surface of the collar portion, facing away from the hollow neck portion, with electrically conductive pads, the heat transfer may be improved. The electrically conductive pads are proficient heat conductors and the heat generated by the light emitting elements may thus be conducted through the pads and through the rest of the collar portion to the surface facing toward the hollow neck portion. The heat may then dissipate to the surrounding air in the proximity to the surface of the collar portion facing the hollow neck portion. However, it is also conceivable that some embodiments have electrically conductive pads covering 85% or as much as 95% of the surface of the collar portion facing away from the neck portion, to further increase the heat transfer away from the light emitting elements.

According to an embodiment of the invention, the hollow neck portion of the housing may hold driver electronics.

The hollow neck portion may provide protection from the physical environment. Furthermore, by arranging the driver electronics in the hollow neck portion the driver electronics may be easily accessible. The easy access may be useful when installing the driver electronics in the hollow neck portion and when electrically connecting the driver electronics to the electrically conductive pads.

According to an embodiment of the invention, the driver electronics may be electrically connected to two of the electrically conductive pads to provide connections in series for the light emitting elements.

By connecting the lighting devices in series fewer connections to the pads are needed. This provides for a more easily installed lighting device. Furthermore, the light emitting elements may be arranged to be connected to a first electrically conductive pad and a second electrically conductive pad. The light emitting elements forming an electrical connection between the first and second electrically conductive pad, may provide connections of the intermediate electrically conductive pads to the two electrically conductive pads, having direct contact with the driver electronics through electrical circuit lines. Furthermore, for series connected lighting devices with more than two electrically conductive pads, a light emitting device may not be arranged between the two electrically conductive pads having electrical circuit lines to the driver electronics. However, the light emitting element may be in physical contact to one of the two electrically conductive pads in electrical contact with the driver electronics and an adjacent electrically conductive pad or in physical contact with two intermediate electrically conductive pads. However, when the lighting device have only two electrically conductive, the lighting devices may be in physical contact to both of the two electrically conductive pads having electrical circuit lines to the driver electronics. The electrical circuit line may be any type of electrical connection that allows electricity to flow to the pads.

According to an embodiment of the invention, the driver electronics may be electrically connected to each of the electrically conductive pad to provide connections in parallel for the light emitting elements.

By providing parallel connections for the light emitting elements, the lighting device may be less sensitive for imperfections in the construction of the lighting device.

According to an embodiment of the invention, the collar portion may be an annular surface surrounding the neck portion.

An annular surface is symmetric and a lighting device with an annular surface may be applicable in many lighting arrangements and different lamp-holders.

According to an embodiment of the invention, the lighting device may further comprise an annular lens arranged opposite the surface of the collar portion with respect to the light emitting elements and the annular lens may be configured to refract light emitted from the light emitting elements.

The annular lens may provide a suitable light distribution. The lens may refract light emitted by the light emitting elements such that the light distribution may be broadened increasing the divergence of the beams emitted from the light emitting elements. The annular lens may facilitate a half-spherical light distribution from the lighting device, or light distribution covering at least a portion of a half sphere in the direction of the general light output direction.

According to an embodiment of the invention, the surface of the collar portion may be orthogonal to a direction along the elongated neck portion.

The orthogonal position of the collar portion may improve the light distribution of the lighting device.

According to an embodiment of the invention, a neck cover is arranged to cover an open end of the neck portion surrounded by the collar portion.

The neck cover may further isolate the driver electronics in combination with the hollow neck portion. The neck cover may further fixate the lens to the lighting device. Further, the neck cover may be an integrated part of the lens.

According to an embodiment of the invention, a first angle between the surface of the collar portion, facing away from the neck portion, and the neck portion may be larger than a second angle between the second surface of the collar portion facing the neck portion and the neck portion.

By having the first angle to be larger than the second angle, the heat management of the lighting device may be improved in combination with the light distribution of the lighting device. The first angle may be larger than 180° while the second angle is smaller than 180°

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
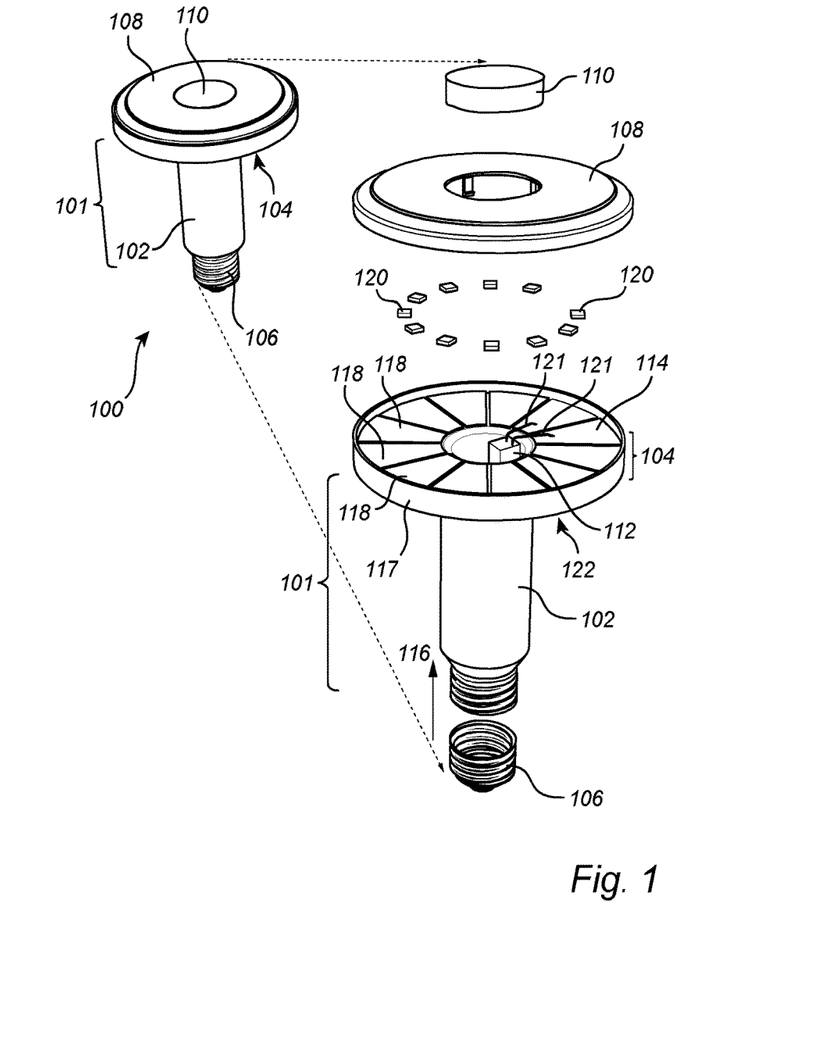
FIG. 1 illustrates a perspective view of a lighting device according to an embodiment and an exploded perspective view of the same lighting device.

With reference to FIG. 1, a lighting device according to an embodiment will be described. FIG. 1 illustrates, in a perspective view, a lighting device according to an embodiment of the invention in an assembled view and in an exploded view. The lighting device 1 viewed to the left is an assembled lighting device. An exploded view of the lighting device 1 is viewed to the right.

The lighting device 1 in FIG. 1 comprises a housing 101 divided into a hollow neck portion 102 and an annular collar portion 104 surrounding an open end of the hollow neck portion 102. The housing 101 comprises the hollow neck portion 102 and the collar portion 104 and the housing is made out of polymer material, such as plastic.

A socket 106 is attached on the opposite end of the neck portion 102. Here, the socket 106 is threaded cap. However, other sockets are conceivable. For example, the socket 106 may be a bayonet coupling, or a plug connector.

In addition, an annular lens 108 is connected to the collar portion 104 on a side of the collar portion 104 facing away from the neck portion 102. The annular lens 108 has the shape of a doughnut to cover the annular collar portion 104. However, other shapes of the collar portion are conceivable, such as a polygonal shape, an elliptical shape or an oval shape. Consequently, the annular lens 108 has preferably the corresponding shape to the collar portion 104. The annular lens 108 is attached to the collar portion 104 through a neck cover 110. The neck portion in FIG. 1 is circular. However, any type of polygonal shape, elliptical, oval shape may also be conceivable.

As stated above the assembled lighting device is illustrated to the right in an exploded view. As may be seen from the figure to the right, the neck portion 102 is hollow to accommodate the driver electronics 112. The hollow neck portion 102 is arranged to protect and at least partly isolate the driver electronics 112 from external strain from the physical environment. At an end of the hollow neck portion 102 a threaded cap 106 is situated arranged to be rotated into a corresponding receiving socket.

The collar portion 104 surrounds the opposite end of the hollow neck portion 102. The collar portion 104 is, in FIG. 1, an annular essentially flat surface 114. The surface 114 of the collar portion 104 is orthogonal with respect to a direction 116 along the elongated hollow neck portion 102. However, in other embodiments the collar portion 104 may be arranged with either a smaller or larger angle than 90° compared to the direction 116 along the elongated neck portion 102. The collar portion 104 may further be arranged with a protruding border 117 to protect the surface 114 in the direction 116 along the elongated neck portion 102. A plurality of light emitting elements 120 are arranged on the essentially flat surface 114 of the collar portion 104. The collar portion 104 protrudes from the neck portion 102, such that heat generated from the light emitting element may dissipate directly through the collar portion 104 to the surroundings, without having to be transferred through the rest of the housing. Thus, the collar portion 104 is arranged to protrude away from the neck portion 102 in order to transfer heat efficiently.

The surface 114 of the collar portion 104 is metalized, and structured into a plurality of electrically conductive pads 118. The metallization process of the pads 118 may be accomplished through deposition of metallic material. The metal may be deposited through electrolysis such as electroplating. For example, electroplating pads may provide a thin copper segment. However, other metallization process of providing the electrically conductive pads 118 to the surface of the collar portion may also be conceivable such as, LDS, UV solidification, print conductive ink, electroless plating or chemical deposition such as plating, chemical solution deposition (CSD), spin coating, chemical vapor deposition (CVD) or atomic layer deposition (ALD). Alternatively, the metallization process may be provided through physical deposition including physical vapor deposition (PVD), sputtering, pulsed laser deposition, cathodic arc-deposition or electro hydrodynamic deposition. The deposited metal through the metallization process may preferably be copper. Copper may proficiently conduct both electricity and heat. However, other metals may also be conceivable.

The electrically conductive pads 118 are arranged successively after each other. The pads 118 are separated from each other to keep the pads 118 electrically isolated to avoid short circuiting the lighting device 100. The pads 118 may be distributed on the surface 114 of the collar portion 104 in different patterns. The pads 118 may be arranged as a single row around the collar portion 104. However, the pads 118 may be distributed around the collar portion 104 in a plurality of rows. The pads are utilized as an electrode connected to a plurality of light emitting elements 120, similar to the circuit path of a PCB. The pads 118 may be segments distributed around the annular surface of the collar portion facing away from the neck portion. The pads may have any shape, such as circular, a polygonal shape, elliptical, oval, irregular shape. The pads may also be arranged as concentric pads, such as annular concentric pad.

Two of the pads are directly connected to the driver electronics 112 through circuit lines 121. The light emitting elements are connected between the intermediate pads and between an intermediate pad 118 and a pad connected to the driver electronics with a circuit line 121. However, if the lighting device only has two pads the light emitting elements may be connected between both of the pads connected to the driver electronics 112. The circuit lines 121 are arranged to convey electricity to the pad so the light emitting elements may emit light.

The plurality of light emitting elements 120 is arranged on the surface 114 of the collar portion 104 facing away from the elongated hollow neck portion 102. Each light emitting element 120 is connected to two pads 118. The pads 118 become electrically connected through the light emitting elements 120. The light emitting elements 120 connects a first terminal with a first pad and a second terminal with a second pad.

The light emitting elements 120 are arranged to emit light in a general light output direction coinciding with the direction 116 along the elongated hollow neck portion 102 towards the collar portion 104. The light emitting elements 120 may be light sources such as LEDs.

The light emitting elements 120 generate heat as a byproduct when light is emitted from the elements 120. The light emitting elements 120 are connected to the pads 118 and heat is dissipated, in the opposite direction to the general light output direction, through the collar portion 104. Heat is dissipated firstly through the pads 118 of the collar portion 104 of the housing 101, and then through the polymer layer of the collar portion 104 out to the surroundings. It is only the collar portion 104 that separates the light emitting elements 120 from the surroundings. A second surface 122 of the collar portion 104 is arranged to dissipate heat to the surrounding air, the second surface 122 is the surface facing the neck portion 102. The second surface 122 is not enclosed in any way. The second surface 122 is in direct contact with the surroundings. This results in that the heat dissipation through the collar portion 104 is facilitated and that air from the surroundings may circulate freely to provide a transfer of thermal energy from the second surface 122 to the circulating air.

The annular lens 108 is connected to the collar portion 104 on a side of the collar portion 104 facing away from the neck portion 102. The annular lens is arranged to refract light emitted by the light emitting elements to broaden the light distribution outputted to the surroundings. The neck cover 110 may be arranged as in FIG. 1 to attach the annular lens 108 to the collar portion 104. Furthermore, the neck cover 110 may protect and isolated the driver electronics together with the housing and in some cases also together with the annular lens. In an alternative embodiment, the annular lens and neck cover may be exchanged with a convex lens covering the collar portion 104 and the open end of the hollow neck portion 102 like a dome. In this alternative embodiment, a neck cover is not necessary, instead the lens is arranged to act as a neck cover as well as a lens refracting light from the light emitting elements. In this embodiment, the horizontal cross-section of the lens corresponds to the surface of the collar portion and the open end of the hollow neck portion.

The housing 101 of the lighting device 100 is in this embodiment shaped as a top hat, where the collar portion 104 corresponds to the brim, which is orthogonal to the neck portion corresponding to the top of the top hat. The collar portion 104 may be slanted so the angle between the second surface of the collar portion and the neck portion is decreased or increased, like the brim of a hat may be turn upward or downward. A decreased angle between the second surface collar portion and the neck portion may provide a lighting device having an increased light distribution. However, the angle between the collar portion and the neck portion may be increased to provide a lighting device with a more focused light distribution. To provide a lighting device with a more focused light distribution, the angle between the neck portion and the second surface 122 of the collar portion may larger than 90°. The transition between the collar portion and the neck portion, is not necessarily a sharp angle, the lighting device may have a bell-shaped housing such that the transition is curved.

Furthermore, the collar portion 104, for the lighting devices, is arranged to have a first angle between the flat surface 114 of the collar portion 104 facing away from the neck portion and an inner surface of the neck portion 102 that is larger than a second angle between the second surface 122 of the collar portion 104 facing the neck portion and the outer surface of the neck portion 102. Consequently, the first angle is larger than 180° while the second angle is smaller than 180°. Furthermore, an increase in the first angle will result in the corresponding decrease in the second angle and vice versa. The first angle is (180+x)° while the second angle is (180-x)°. For the example illustrated in FIG. 1, the first angle is 270° while the second angle is 90°. The inner surface of the neck portion 102 faces the driver electronics 112. The outer surface of the neck portion 102 faces the surroundings of the lighting device 100.

Figure 2:
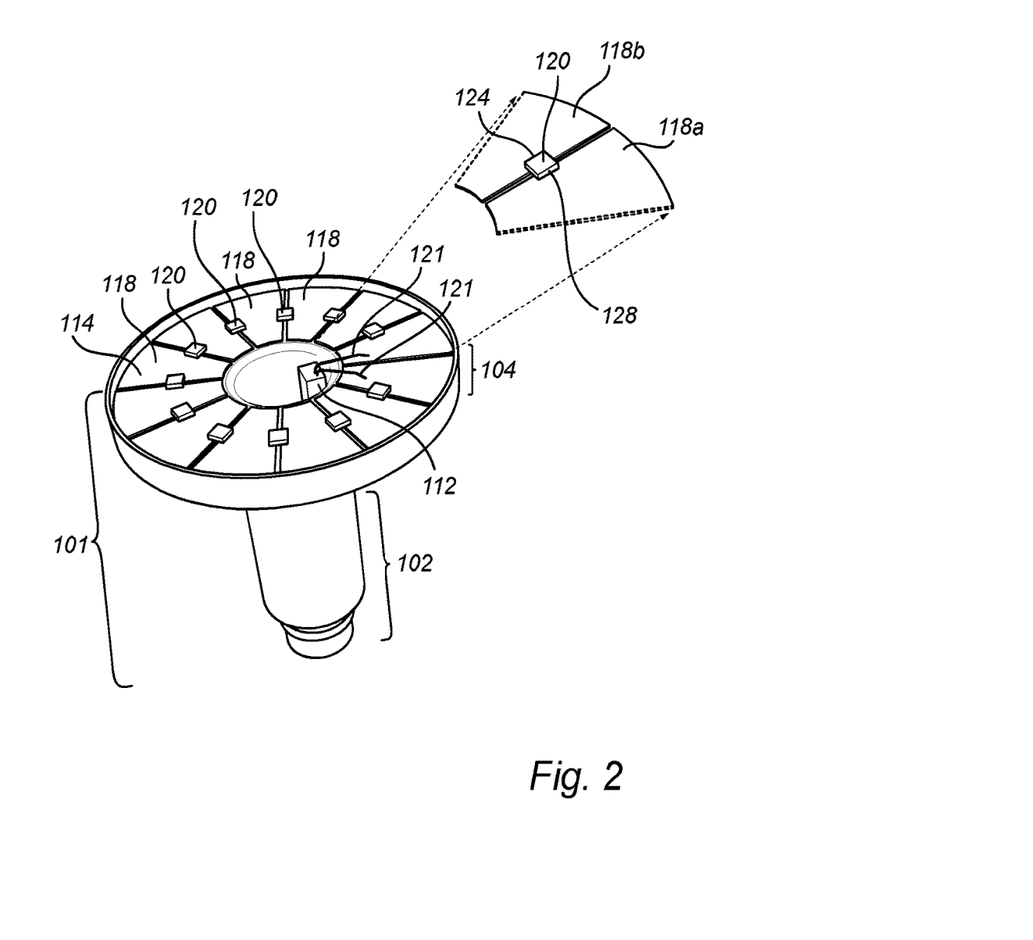
FIG. 2 illustrates a perspective view of a portion of the lighting device in FIG. 1.

A portion of the lighting device 100 in FIG. 1 will be described with reference to FIG. 2. The portion of the lighting device 100 illustrates an assembled perspective view of the lighting device 100 in FIG. 1 without the lamp socket, annular lens or the neck cover. The lighting device 100 has a housing 101 with an elongated hollow neck portion 102 and a collar portion 104. The collar portion 104 has electrically conductive pads 118 distributed around the annular surface 114 facing away from the neck portion 102.

Each light emitting elements 120 is arranged to be electrically connected to two pads 118. Two of the pads 118, which are not electrically connected with light emitting element 120 to each other, are connected with a circuit line 121 each to the driver electronics 112. The light emitting elements are arranged to be connected in series. Furthermore, a cut-out portion of the collar portion 104 illustrates the connection of light emitting element 120 to the pads 118. The pads 118 become electrically connected through the light emitting elements 120. The light emitting element 120 connects a first terminal 128 with a first pad 118a and a second terminal 124 with a second pad 118b.

Figure 3:
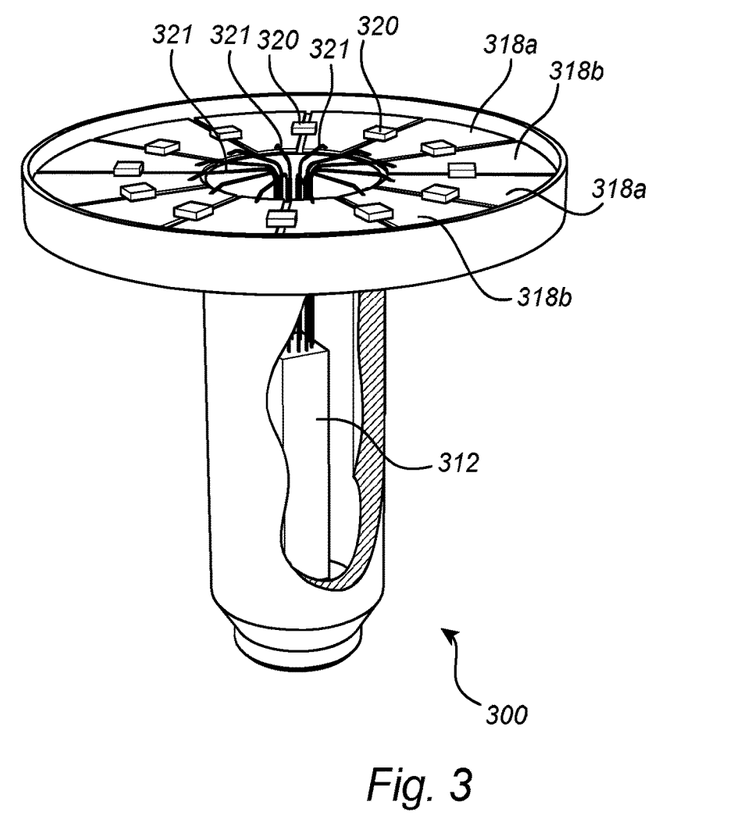
FIG. 3 illustrates a perspective view of a lighting device according to an embodiment.

A lighting device 300 according to an embodiment will be described with reference to FIG. 3. The lighting device 300 illustrates a lighting device as in FIG. 2 with the difference of the connection to the driver electronics 312. Each of the pads 318 are connected with a circuit line 321 to the driver electronics 312. The light emitting element are arranged to connect a first terminal to a first pad 318a and second terminal to a second pad 318b. By providing a connection to each pad 318 to the driver electronics 312, a parallel connection of the light emitting elements 320 may be achieved. A first pad 318a is arranged to have a second pad 318b on each side of the first pad 318a. Each adjacent pad to a first pad 318a is a second pad 318b. Consequently, each adjacent pad to a second pad 318b is a first pad 318a. The risk of the lighting device 300 not being operational, i.e. not being able to emit light, is reduced. Even if one of the light emitting elements were out of order, other light emitting elements 320 may emit light independently.

Figure 4:
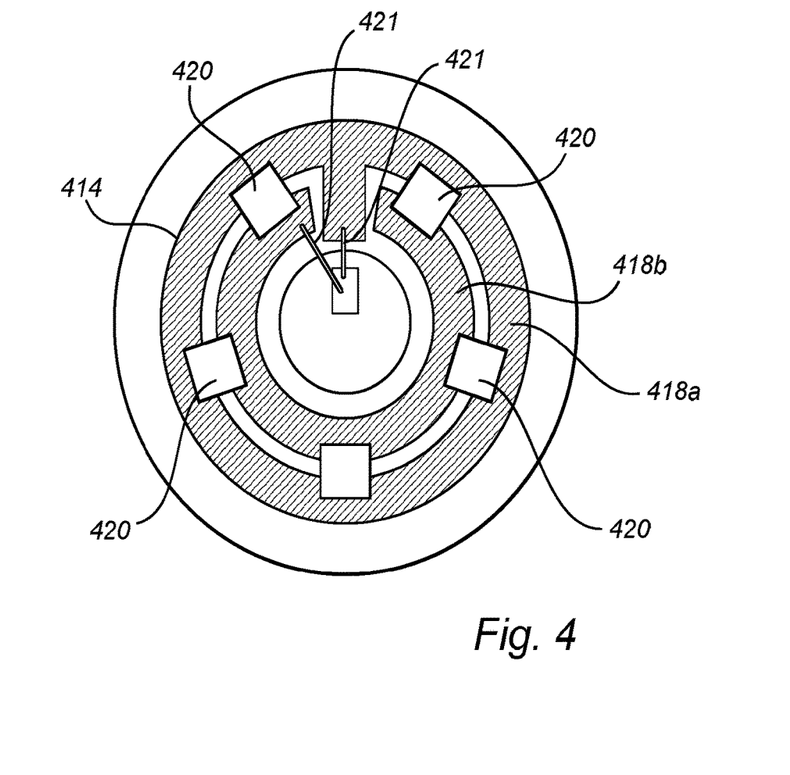
FIG. 4 illustrates a top view of collar portion according to an embodiment.

A top view of a collar portion according to an embodiment will be described with reference to FIG. 4. The collar portion with a metalized surface may have electrically conductive pads 418a, 418b, that are concentric, arranged on the surface of the collar portion facing away from the neck portion. The first and second conductive pad 418a 418b are concentrically arranged on the collar portion with different radii. The electrically conductive pads may be annular concentric. However, in FIG. 4 the first electrically conductive pad 418a is an annular pad arranged concentric around the open hollow end of the neck portion. Furthermore, the electrically conductive pads may have a protrusion to facilitate the connection to the driver electronics. In FIG. 4, the first pad 418a has such a protrusion. The protrusion facilitates a connection from the first electrically conductive pad 418a to the driver electronics through the electrical circuit line 421. The second electrically conductive pad 418b is in FIG. 4 a discontinuous annular pad. The second pad 418b is discontinuous where the protrusion portion of the first pad 418a has a protrusion protruding in the direction of the open end of the neck portion. The second pad 418b is arranged closer to the open end of the neck portion and the first pad 418a surrounds the first pad. Furthermore, the first pad 418a is concentrically arranged around the second pad 418b. However, the reverse is also conceivable. The light emitting element 420 may have a first terminal connected to the first pad 418a and a second terminal connected to the second pad 418b. The light emitting elements 420 overlap a gap between the first pad 418a and the second pad 418b. The light emitting elements 420 are distributed around the essentially flat surface of the collar portion.

Figure 5:
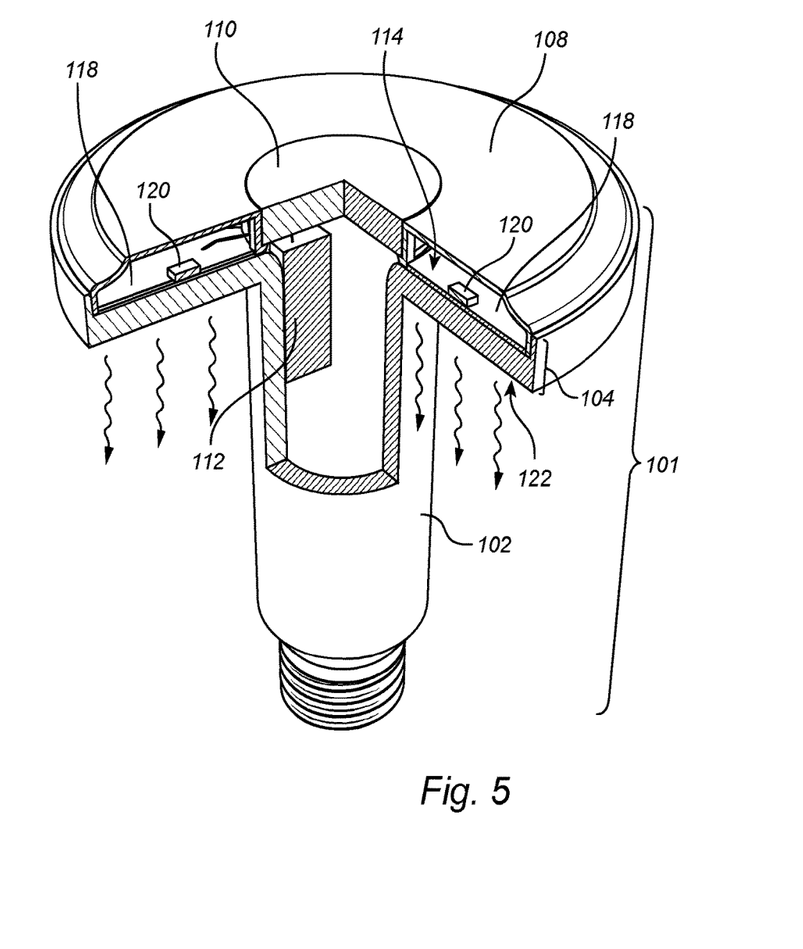
FIG. 5 illustrates a perspective view of the lighting device according to FIG. 1 with a cut section.

A perspective view of the lighting device 100, having a cut section, according to the embodiment in FIG. 1 will be described with reference to FIG. 5. The lighting device 100 in FIG. 5 corresponds to the lighting device 100 described with reference to FIG. 1. The cut section of the lighting device 100 is an intersection from the centre of lighting device straight outwards in the radial direction. The centre of the lighting device may be views as the symmetry axis that is parallel to the direction 116 in FIG. 1. The centre of the lighting device 100 may also be viewed as the centre of mass for the lighting device 100 and/or the collar portion 104 and neck portion 102. The centre of mass and the symmetry axis coincide in FIG. 5.

The housing 101 of the lighting device 100 comprises a hollow neck portion 102 and a collar portion 104. The neck portion 102 and the collar portion 104 are integrated with each other. The collar portion 104 and the neck portion 102 comprise a layer of polymer material. Along the inner side wall of the neck portion 102 the driver electronics 112 is arranged. However, in other embodiments the driver electronics 112 may be located in the centre of the neck portion 102. The collar portion 104 has an additional thin layer of a pad 118.

The light emitting element 120 is arranged on top of two adjacent pads 118. The heat generated by the light emitting elements may dissipate through the collar portion from the surface 114 with the light emitting elements 120 to the opposite surface 122. The heat may then be transferred to circulating air in the surroundings. Furthermore, when the air is heated by heat dissipated from the light emitting elements 120 the air will naturally start to circulate below the surface 122 of the collar portion 104 opposite the surface 114 facing away from the neck portion 102. In addition, the light emitted from the light emitting elements 120 may be broadened by the annular lens 108. The lens 108 is kept into place by the neck cover 110. The neck cover 110 is further arranged to protect the driver electronics 112 in the hollow neck portion 102.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A lighting device comprising
  a housing having an elongated hollow neck portion, a collar portion arranged at a first end of said neck portion,
  said collar portion including
    a first surface surrounding the first end of the neck portion peripherally, said first surface being metalized and structured into a plurality of electrically conductive pads, said pads being electrically isolated from each other, and
    a second surface of the collar portion arranged opposite the first surface and in direct contact with the surroundings, the second surface is arranged facing the neck portion
  a plurality of light emitting elements arranged on the first surface so as to be separated from the surroundings by the collar portion only, whereby said electrically conductive pads are arranged as heat conductors for conducting the heat generated by the light emitting elements to the second surface and said heat being transferred from the second surface to the surroundings, and
  an annular lens arranged to cover said collar portion and configured to refract light emitted from the light emitting elements to provide a suitable light distribution,
  wherein each of the light emitting elements has a first terminal electrically connected to a first electrically conductive pad and a second terminal electrically connected to a second electrically conductive pad.

2. The lighting device according to claim 1, wherein the metalized first surface structured into said plurality of electrically conductive pads covers at least 75% of said first surface.

3. The lighting device according to claim 1, wherein the hollow neck portion of the housing holds driver electronics.

4. The lighting device according to claim 3, wherein the driver electronics is electrically connected to two of the electrically conductive pads to provide connections in series for the light emitting elements.

5. The lighting device according to claim 3, wherein the driver electronics is electrically connected to each of the electrically conductive pads to provide connections in parallel for the lighting emitting elements.

6. The lighting device according to claim 1, wherein said collar portion is an annular surface surrounding said neck portion.

7. The lighting device according to claim 1, wherein the surface of the collar portion is orthogonal to a direction along the elongated neck portion.

8. The lighting device according to claim 1, wherein a neck cover is arranged to cover an open end of the neck portion surrounded by the collar portion.

9. The lighting device according to claim 1, wherein a first angle between the surface of the collar portion facing away from the neck portion, and the neck portion may be larger than a second angle between the second surface of the collar portion facing the neck portion, and the neck portion.

* * * * *